United States Patent
Khusnatdinov

(10) Patent No.: US 12,463,042 B2
(45) Date of Patent: Nov. 4, 2025

(54) PLANARIZATION SYSTEM AND METHOD

(71) Applicant: CANON KABUSHIKI KAISHA, Tokyo (JP)

(72) Inventor: Niyaz Khusnatdinov, Round Rock, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 545 days.

(21) Appl. No.: 17/829,132

(22) Filed: May 31, 2022

(65) Prior Publication Data

US 2023/0386849 A1    Nov. 30, 2023

(51) Int. Cl.
| | | |
|---|---|---|
| H01L 21/304 | (2006.01) | |
| H01L 21/02 | (2006.01) | |
| H01L 21/48 | (2006.01) | |
| H01L 21/67 | (2006.01) | |
| H01L 21/683 | (2006.01) | |
| H01L 21/768 | (2006.01) | |

(52) U.S. Cl.
CPC ...... *H01L 21/304* (2013.01); *H01L 21/02074* (2013.01); *H01L 21/4842* (2013.01); *H01L 21/67092* (2013.01); *H01L 21/6833* (2013.01); *H01L 21/7687* (2013.01)

(58) Field of Classification Search
CPC ............. H01L 21/304; H01L 21/02074; H01L 21/4842; H01L 21/67092; H01L 21/6833; H01L 21/7687; H01L 21/31058; H01L 21/31051; H01L 21/68757; G03F 7/0002
See application file for complete search history.

(56) References Cited

U.S. PATENT DOCUMENTS

| | | | |
|---|---|---|---|
| 10,131,134 B2 | 11/2018 | Khusnatdinov | |
| 10,228,624 B2 | 3/2019 | Yonekawa | |
| 2004/0200411 A1* | 10/2004 | Willson | B82Y 10/00 |
| | | | 118/503 |
| 2009/0246309 A1* | 10/2009 | Washiya | B29C 35/0888 |
| | | | 425/174.6 |
| 2014/0314897 A1* | 10/2014 | Ahn | B41C 1/10 |
| | | | 427/383.1 |
| 2018/0356741 A1 | 12/2018 | Matsuoka et al. | |

FOREIGN PATENT DOCUMENTS

| | | | | |
|---|---|---|---|---|
| JP | 2015-149390 A | 8/2015 | | |
| JP | 2019-004116 A | 1/2019 | | |
| KR | 20080046986 A | 5/2008 | | |
| KR | 20110063800 A | 6/2011 | | |
| KR | 20180056422 A | 5/2018 | | |
| TW | 201526723 A | 7/2015 | | |
| TW | I661925 B | * | 6/2019 | ......... H01L 21/0271 |
| WO | 2017/149992 A1 | 9/2017 | | |

* cited by examiner

*Primary Examiner* — Mohammed Shamsuzzaman
(74) *Attorney, Agent, or Firm* — Canon U.S.A., Inc. IP Division

(57) ABSTRACT

A planarization system for forming a formable material film on a substrate by using a superstrate is provided. The superstrate has a first side that comes into contact with the formable material in a case where the superstrate is stacked with the substrate, and a second side opposite to the first side. The planarization system has a first conductive portion at the second side of the superstrate and a second conductive portion at the side of the superstrate. Both the first conductive portion and the second conductive portion are grounded during a separation process to separate the superstrate from the formable material on the substrate.

12 Claims, 9 Drawing Sheets

PLANARIZATION SYSTEM AND METHOD

BACKGROUND

Field of Art

The present disclosure relates to substrate processing, and more particularly, to the nanoimprint lithography or planarization of surfaces in semiconductor fabrication.

Description of the Related Art

Imprint and planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArF laser-based lithography, planarization improves depth of focus (DOF), critical dimension (CD), and critical dimension uniformity. In extreme ultraviolet lithography (EUV), planarization improves feature placement and DOF. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in nanoimprint lithography and planarization techniques, including IAP techniques, are desired for improving, e.g., whole wafer processing, step and repeat processing, and semiconductor device fabrication.

SUMMARY

A planarization or imprint system including at least a superstrate and a substrate sandwiching a formable material therebetween is provided. The superstrate having a first side in contact with the formable material and a second side opposite to the first side. A first conductive portion is provided at the second side of the superstrate. The substrate includes at least a second conductive portion. Both the first conductive portion and the second conductive portion are grounded during a separation process to separate the superstrate from the substrate. The first conductive portion may include a transparent conductive layer formed on the second side of the superstrate before an imprint process performed on the formable material. The first conductive portion may be placed at the second side of the superstrate after a UV exposure has been performed on the formable material. The first conductive layer may also include a conductive superstrate chuck to retain the superstrate during an imprint process. The first conductive portion may be made of chromium (Cr), tin nitride (TiN), or tin oxide ($SnO_2$). The first conductive portion may be in the form of a film, a sheet, or a wire mesh made for example from stainless steel, aluminum or other conductive material. In one embodiment, the first conduct layer has a thickness of about 10 nm to about 15 nm.

The second conductive portion may include the substrate made of conductive material. The second conductive portion may alternatively include a conductive layer formed on the substrate. The second conductive portion may also include a conductive substrate chuck such as specially prepared non-stoichiometric silicon carbide (SiC) retaining the substrate during an imprint process.

A method is provided, including curing a formable material sandwiched between a superstrate and a substrate and separating superstrate and the substrate with the following steps. A back side of the superstrate is ground, wherein the back side is opposite to a front side of the superstrate in contact with the formable material. The bottom side of substrate that is in contact to the wafer chuck is grounded. Separating the superstrate away from the substrate, or moving the substrate away from the superstrate, in a vertical direction while both the back side of the superstrate and the substrate are grounded and until an electric field between the superstrate and the cured formable material is below a predetermined value. The superstrate and the substrate are moved further away from each other in a lateral direction in order, for example, to unload substrate or superstrate, or both. A surface discharging is performed while moving the superstrate with respect to the substrate (or moving the substrate with respect to the superstrate) in the lateral direction.

A method of reducing electrostatic field during a separation process for separating a superstrate from a substrate includes introducing a first capacitor between at a back side of the superstrate and a ground, wherein the back side is opposite to a front side in contact with a formable material sandwiched between the superstrate and the substrate, introducing a second capacitor between the superstrate and the ground, and connecting the ground with both the second capacitor and a third capacitor to form a close loop of electric current comprising the first capacitor, the third capacitor formed between the superstrate and the formable material during a separation process, and the second capacitor connected in series. The method may further comprise separating the superstrate from the substrate in a vertical direction in the separation process until the superstrate and the substrate is completely separated and an electric field between the superstrate and the substrate is reduced to a predetermined value; and moving the superstrate in a lateral direction with respect to the substrate (or moving the substrate in the lateral direction with respect to the superstrate). A surface discharge process may be performed before moving the superstrate in the lateral direction with respect to the substrate. The first capacitor may be introduced by providing a conductive layer at the back side of the superstrate and an electric connection between the conductive layer and the ground. The conductive layer may be formed with transparent material on the back side superstrate before performing an imprint process. The conductive layer may be formed on the back side of the superstrate after a UV exposure has been performed. The first capacitor may be introduced by providing a conductive superstrate chuck to retain the superstrate during the separation process and an electric connection between the conductive superstrate chuck and the ground. The second capacitor may be introduced by providing the substrate made of conductive material and an electric connection between the substrate and the ground. The first capacitor may also be introduced by providing a conductive substrate chuck to retain the superstrate during the separation process and an electric connection between the conductive substrate chuck and the ground.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Figure 1:
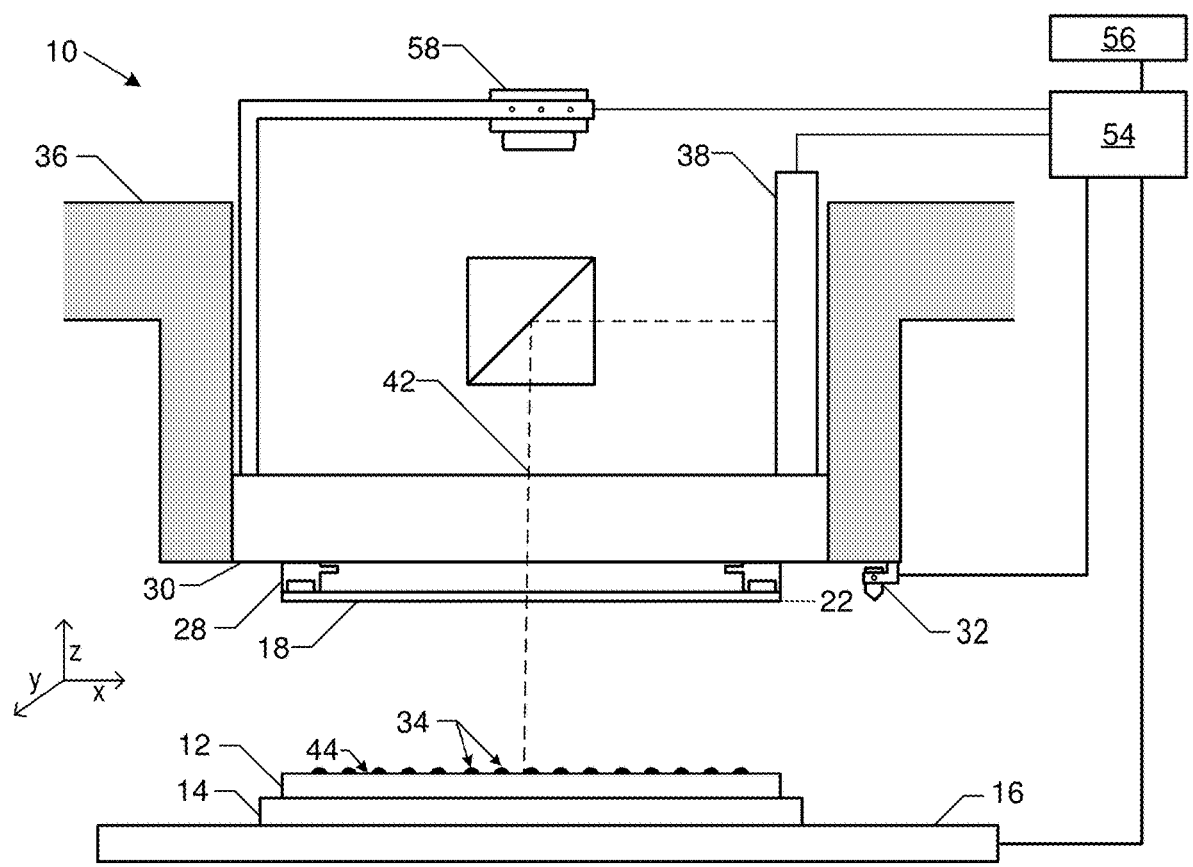
FIG. 1 is a diagram illustrating a planarization and/or an imprint system.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

FIG. 1 illustrates a nanoimprint and/or planarization system 10 in which an embodiment may be implemented. The system 10 may be used to planarize the substrate 12 or form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like.

The substrate 12 and the substrate chuck 14 may be further supported by positioning stage 16. The stage 16 may provide translational and/or rotational motion along one or more of the x, y, z, θ, and ϕ axes. The stage 16, the substrate 12, and the substrate chuck 14 may also be positioned on a base (not shown).

Spaced-apart from the substrate 12 is a superstrate 18 used to planarize the substrate. The superstrate is a flat planar member. In an alternative embodiment the superstrate 18 is a template 18. The template 18 may include a body having a first side and a second side with one side having a mesa (also referred to as mold) extending therefrom towards the substrate 12. The mesa may have a shaping surface 22 thereon. Alternatively, the template 18 may be formed without a mesa.

The template 18, that is, the superstrate 18, and/or the mold may be formed from such materials including, but not limited to, fused-silica, quartz, silicon, organic polymers, siloxane polymers, borosilicate glass, fluorocarbon polymers, metal, hardened sapphire, and/or the like. As illustrated, shaping surface 22 may be a planar surface or may comprise features defined by a plurality of spaced-apart recesses and/or protrusions, though embodiments of the present invention are not limited to such configurations. The shaping surface 22 may define any original pattern that forms the basis of a pattern to be formed on the substrate 12. The shaping surface 22 may be blank, i.e. without pattern features, in which case a planar surface can be formed on the substrate 12. In an alternative embodiment, when the shaping surface 22 is of the same areal size as the substrate, a layer can be formed over the entire substrate (e.g., whole substrate processing). In an alternative embodiment, when the shaping surface 22 is smaller than the substrate, a layer can be formed over a portion of the substrate one at a time which is then repeated to cover the entire substrate (e.g., step and repeat processing).

The superstrate 18 (template 18) may be coupled to a superstrate chuck 28 (template chuck 28). The superstrate chuck 28 may be configured as, but not limited to, vacuum, pin-type, groove-type, electrostatic, electromagnetic, and/or other similar chuck types. Further, the superstrate chuck 28 may be coupled to a head 30 which in turn may be moveably coupled to a bridge 36 such that superstrate chuck 28, the head 30 and the template 18 are moveable in at least the z-axis direction.

The system 10 may further comprise a fluid dispense system 32. Fluid dispense system 32 may be used to deposit a formable material 34 (e.g., polymerizable material) on substrate 12. The formable material 34 may be positioned upon the substrate 12 using techniques such as drop dispense, spin-coating, dip coating, chemical vapor deposition (CVD), physical vapor deposition (PVD), thin film deposition, thick film deposition, and/or the like. The formable material 34 may be disposed upon the substrate 12 before and/or after a desired volume is defined between the superstrate 18 (mold) and the substrate 12 depending on design considerations.

The fluid dispense system 32 may use different technologies to dispense the formable material 34. When the formable material 34 is capable of jetting, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The system 10 may further comprise radiation source 38 that directs actinic energy along a path 42. The head 30 and the stage 16 may be configured to position the template 18 and the substrate 12 in superimposition with the path 42. A camera 58 may likewise be positioned in superimposition with the path 42. The system 10 may be regulated by a processor 54 in communication with the stage 16, the head 30, the fluid dispense system 32, the source 38, and/or the camera 58 and may operate on a computer readable program stored in a memory 56.

Either the head 30, the stage 16, or both vary a distance between the superstrate 18 (mold) and the substrate 12 to define a desired volume therebetween that is filled by the formable material 34. For example, head 30 may apply a force to template 18 such that the mold contacts the formable material 34. After the desired volume is filled with the formable material 34, the source 38 produces actinic energy (e.g., ultraviolet radiation) causing the formable material 34 to solidify and/or cross-link conforming to a shape of a surface 44 of the substrate 12 and the surface 22 of the template 18, defining a formed layer on the substrate 12.

Planarization Process

Figure 2A:
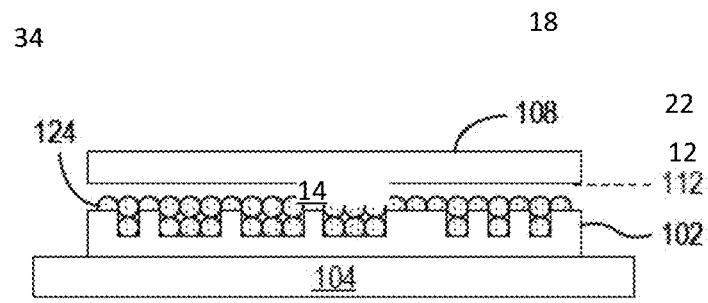
FIG. 2A to 2C illustrates a planarization and/or imprint process.
Figure 2B:
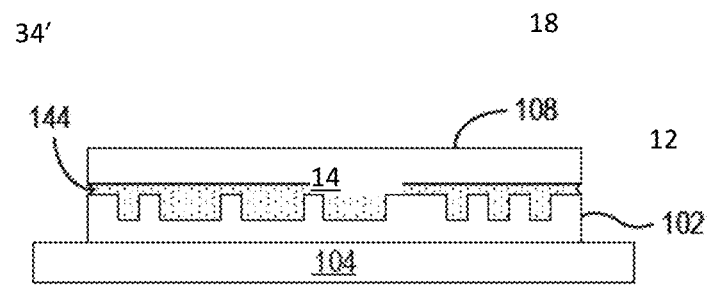
Figure 2C:
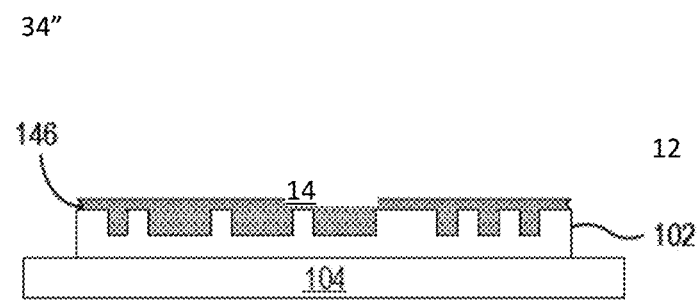

The planarization process and nanoimprint process include steps which are shown schematically in FIGS. 2A to FIG. 2C which may make use of the planarization or the nanoimprint system 10 configured to perform the planarization process or nanoimprint process. As illustrated in FIG. 2A, the formable material 34 in the form of droplets is dispensed onto the substrate 12. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 34 is varied depending on the substrate topography and/or the template topography. The superstrate 18 is then positioned in contact with the formable material 34. As used herein, template and superstrate are used interchangeably to describe an object with a shaping surface 22 that is brought into contact with the formable material 34 to control the shape of the formable material 34. As used herein, template chuck 28 and superstrate chuck 28 are used interchangeably to hold the template 18 or the superstrate 18.

FIG. 2B illustrates a post-contact step after the superstrate 18 has been brought into full contact with the formable material 34 but before a polymerization process starts. The superstrate 18 is equivalent to the template 18 in FIG. 1 and is substantially featureless (may include alignment or identification features) and may be substantially the same size and shape as the substrate (a characteristic dimension such as average diameter of the superstrate 18 may be within at least 3% of a characteristic dimension of the substrate 12). In an alternative embodiment, the superstrate 18 is a template 18 may be smaller than the substrate and may have a shaping surface 22 with features that used to form features in the cured layer 34". As the superstrate 18 contacts the formable material 34, the droplets merge to form a formable material film 34' that fills the space between the superstrate 18 and the substrate 12. Preferably, the filling process happens in a uniform manner without any air or gas bubbles being trapped between the superstrate 18 and the substrate 12 in order to minimize non-fill defects. The polymerization process or curing of the formable material 34 may be initiated with actinic radiation (e.g., UV radiation). For example, radiation source 38 of FIG. 1 can provide the actinic radiation causing formable material film 34' to cure, solidify, and/or cross-link, defining a cured planarized layer 34" or a cured layer 34" which may include features on the substrate 12. Alternatively, curing of the formable material film 34' can also be initiated by using heat, pressure, chemical reaction, other types of radiation, or any combination of these. Once cured, the cured layer (planarized layer) 34" is formed, the superstrate 18 can be separated therefrom. FIG. 2C illustrates the cured (planarized) layer 34" on the substrate 12 after separation of the superstrate 18.

Separation Process

Figure 3A:
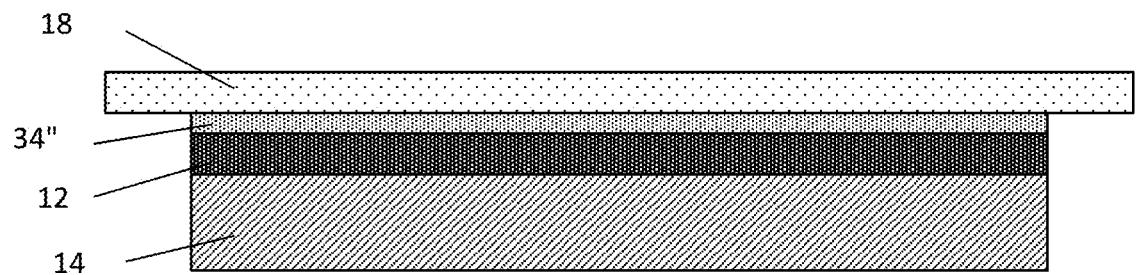
FIGS. 3A to 3C show the superstrate and the substrate of the imprint system during the initial separation process.
Figure 3B:
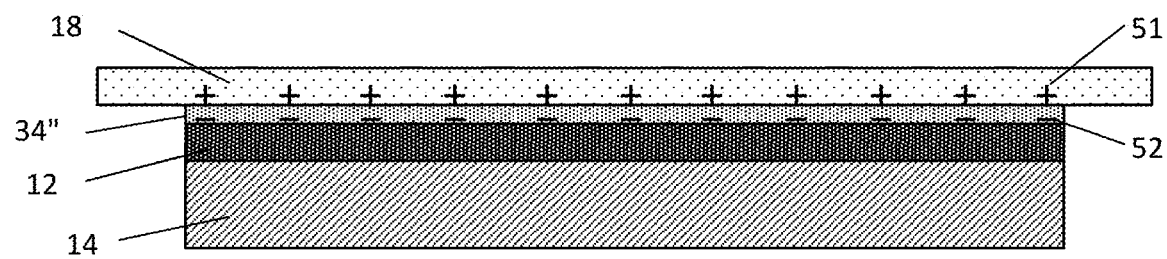

After curing, the superstrate 18 (or template 18) and the planarized layer 34" (or cured layer 34") are separated from each other. As is well understood, electric charges may be generated when two dissimilar materials are brought into contact and separated from each other. For example, this happens when a film of a first material is formed on a surface of a second material. Each of the first and second materials may acquire a net electric charges of the same magnitude with a sign opposite to each other. The charge separation may also be observed in a triboelectric effect due to friction between two materials. The charge separation happens due to a difference of work functions of the two dissimilar materials. The charge separation may also happen to two surfaces of the same materials having different work functions in the areas with different physical or chemical conditions such as mechanical stress or dopant concentrations. FIG. 3A shows a superstrate 18 brought into contact with a formable material 34, where the superstrate 18 and the cured layer 34" are formed of different materials. As shown in FIG. 3B, the charge separation happens even when two materials, that is, the superstrate 18 and the cured layer 34", are in a static contact. Only one interface between 18 and 34 is considered in the current embodiment. The signs of the charges depend on the materials of the contact surfaces. In one embodiment, the charges 51 are positive and the charges 52 are negative while the superstrate 18 formed of a glass material and the cured layer 34" is formed of a polymerized material for example a photoresist, a planarization material, nanoimprint material, or other resist. In some situations, the charges 51 may be negative and the charges 52 may be positive, depending on the materials of the superstrate 18 and the cured layer 34". As the charges 51 and 52 have the same magnitude (absolute value), the electric fields generated by the positive charges 51 and the negative charges 52 compensate each other to produce zero electric field outside of an interface. This is similar to a charged planar capacitor where the electric field outside of the capacitor is zero.

The electric charges generated and accumulated on two surfaces of dissimilar materials may partially survive a quick separation of these two materials. The charge dynamics strongly depends on the nature of the materials and the dynamics of the separation. During separation, most of the electric charges dissipate through a discharge process that includes surface conductance along the separation interface, and electrostatic discharge through the gap filled with air or gas. The final level of the electric charge value is established by lowest ionization threshold of air or gas filling the space. The charges may reduce to levels that cannot be easily dissipated through the known mechanisms. The remaining electric charges may form high electric field and attract dust particles which may contain different materials such as organic, dielectric, semiconductor, conductive, oxide, metal or other particles. These particles may steadily accumulate on the imprint and planarization tool surfaces over time. Laminar flow of air inside the imprint and planarization tools may keep the particles down. However, the electric field may stir the particles to move, jump, or to be attracted to the electrically charged working surfaces of the superstrate and the substrate.

Figure 3C:
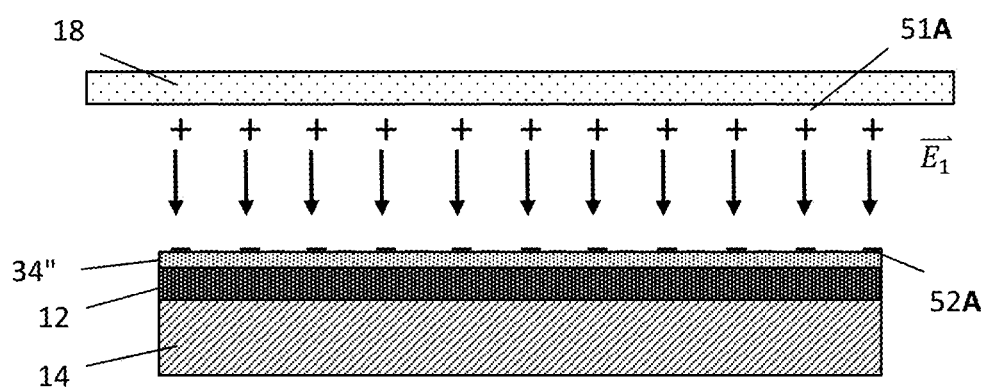

FIG. 3C shows the separation performed by moving the superstrate 18 away from the substrate 12, or by moving the substrate 12 away from the superstrate 18. The separation may generate electric field $\vec{E_0}$ in the gap between the superstrate 18 and the formable material layer 34" (the substrate 12) due to the electric charges 51 and 52. The separation may create electrostatic charges on the contact surfaces of the superstrate 18 and the formable material film 34". When the spatial separation is insignificant, the electric field $\vec{E_0}$ is contained inside the gap between the superstrate 18 and formable material 34. The superstrate 18 and formable material 34 act similarly to an ideal flat capacitor where electric field exists only in the gap between the electrodes. As the electric field is zero or near zero near the edges, no particles outside of the gap will be attracted.

Figure 4:
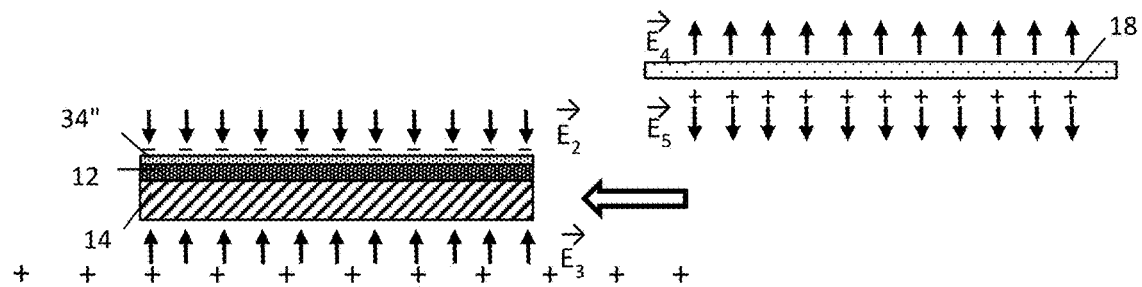
FIG. 4 shows the superstrate and the substrate of the imprint system during a lateral separation process of the imprint process.

As the spatial separation increases, the non-compensated electric charges may create macroscopic electric fields outside of the superstrate 18 and formable material 34 at a distance comparable to the separation gap. For example, as show in FIG. 4, the further separation between the superstrate 18 and the substrate 12 along a lateral direction causes creation of electric fields $\vec{E_2}$, $\vec{E_3}$, $\vec{E_4}$, and $\vec{E_5}$ due to the electric charges 51A and 52A. The electric charges are not compensating each other like the case of the flat capacitor as shown in FIG. 3C, but produce macroscopic electric fields. Experimental evidence shows that the electric fields may easily exceed $1 \times 10^6$ V/m. As understood, for comparison dielectric strength of dry air is within the range of about $1.5 \times 10^6$ V/m to about $3 \times 10^6$ V/m. The dielectric strength defines the electric field threshold at or above which plasma discharge starts. During separation of the superstrate and the substrate, including the initial vertical separation and then the further lateral separation, an electric discharge in air or other gas is possible. If the value of the electric field is less than the dielectric strength, the electric charges are stable. The stable charges, non-compensated electric fields may cause problems with the particle control in the imprint equipment 10. Most of the dust particles are electrically charged due to electrification by friction. Electric fields may move and directly attract or repel the electrically charged particles to the charged superstrate and substrate. In addition, pondermotive forces may push charged particles from regions of high electric fields towards regions of lower electric fields to thereby stir the particles in air.

Figure 5:
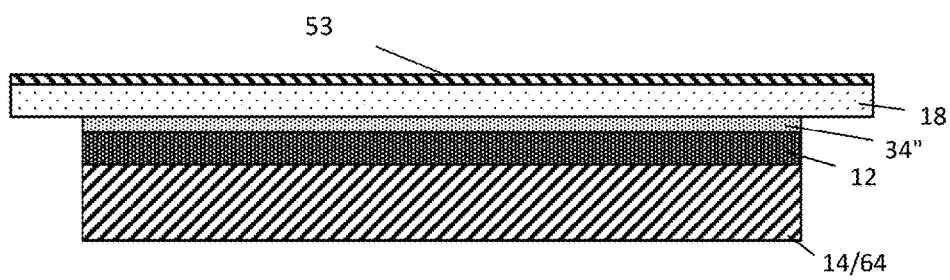
FIG. 5 shows the conductive structures formed at both the superstrate and the substrate according to one embodiment.

To resolve the issues of the displaced charged particles attracted to the electrically charged surfaces of the superstrate and the substrate, an electrically conductive surface may be placed or formed near separation surfaces of the superstrate and the substrate. FIG. 5 shows an embodiment that incorporates conductive structures near the superstrate and the substrate. As shown, a conductive layer 53 may be placed on top of the superstrate 18 opposite the shaping surface 22, and an electrically conductive chuck 14 is used to support the substrate 12. The conductive layer 53 may include a conductive film formed on the back side of the superstrate 18. For example, the conductive film may be a metal film (chromium, Cr) or a conductive film of titanium nitride (TiN) or tin oxide (SnO) formed by vapor or chemical deposition, a metal plate, a metal mesh or other structure. The thickness of the conductive layer 53 may range between 10 nm and 15 nm. The conductive layer 53 may be temporarily or permanently placed at the back side of the superstrate 18 and removed during UV exposure. The conductive layer 53 may be formed of transparent conductive material and either temporarily or permanently placed at the backside of the superstrate 18. The electrically conductive substrate chuck 14 may also in the form of an intermediate electrically conductive layer 64 that may be formed between the substrate 12 and the substrate chuck 14.

Figure 6A:
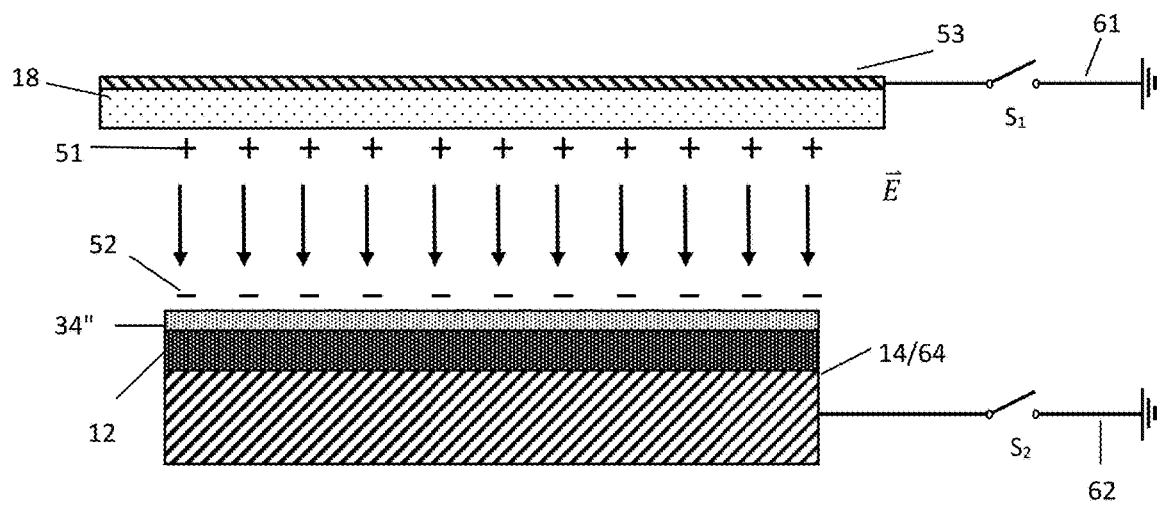
FIG. 6A show the initial separation of the substrate and the superstrate in a vertical direction without grounding.

In FIG. 6A, initial separation between the superstrate 18 and the cured layer 34" on the substrate 12 along the vertical direction is performed. As shown, electric charges 51 and 52 are generated and an electric field $\vec{E}$ exists between the superstrate 18 and the cured layer 34". As shown in FIG. 6A, the conductive structures may be connected to ground via electric paths 61 and 62, respectively. Each of the electric paths 61 and 62 may include a switch S1 and S2 to open or close the connection between the conductive structures 53 and 64 to ground, respectively. Alternatively, the electric connections between the ground and conductive structures 53 and 64 may be permanent without using the switches S1 and S2. Before grounding the conductive structures 53 and 64, for example, before closing the switches S1 and S2, an electric field $\vec{E}$ is established between the superstrate 18 and formable material 34.

Figure 6B:
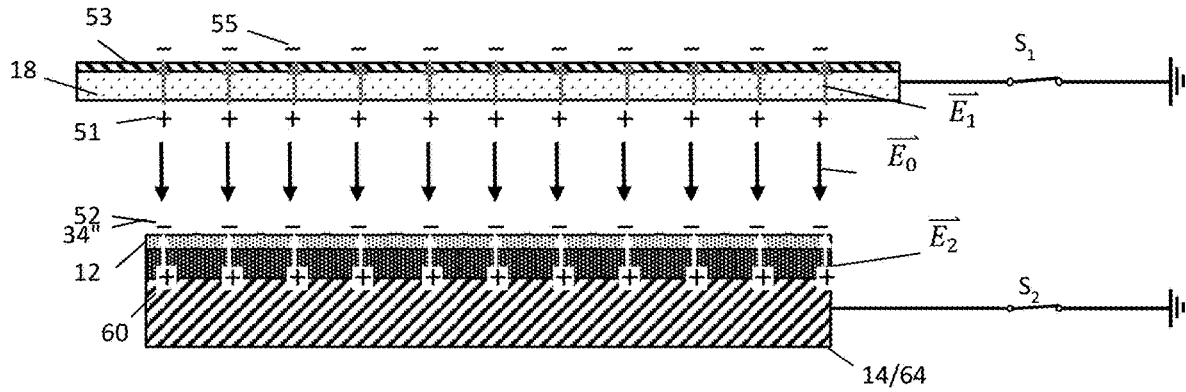
FIG. 6B the same separation process with grounding

FIG. 6B shows the effect of grounding the conductive structures 53 and 64 with closing the switches $S_1$ and $S_2$. Again, other electric paths such as conductive wires may also be used to connect the conductive structures 53 and 64 without the use of the switches $S_1$ and $S_2$. The grounding of the conductive structure 53 leads to the appearance of charges 55 at the backside of the superstrate 18, while the grounding of the conductive structure 64 leads the appearance of the charges 60 at the surface of the substrate chuck 14 due to charge redistribution. The substrate 12 may be considered as a non-conductive dielectric or a semi-conductive silicon wafer. The addition electric charges create the electric fields $\vec{E_1}$ across the superstrate 18 and $\vec{E_2}$ across the substrate 12 in addition to the electric field $\vec{E_0}$, respectively.

Figure 7A:
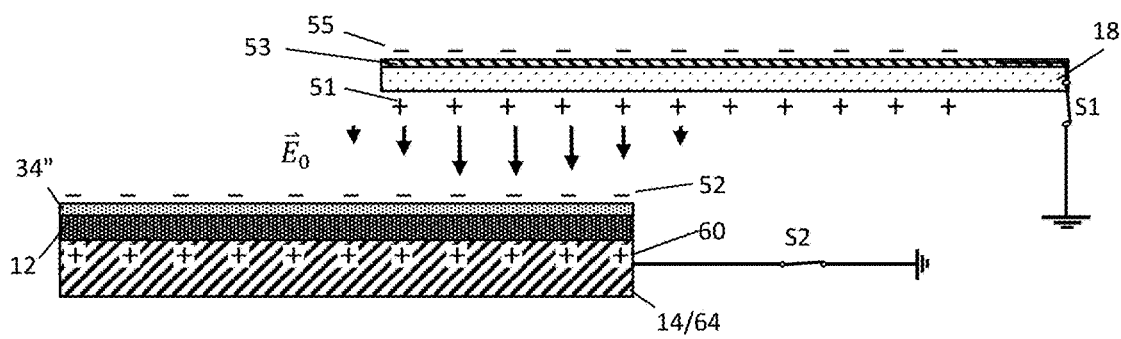
FIGS. 7A and 7B shows various stages of lateral separation of the superstrate with respect to the substrate; and various stages of electric field distribution
Figure 7B:
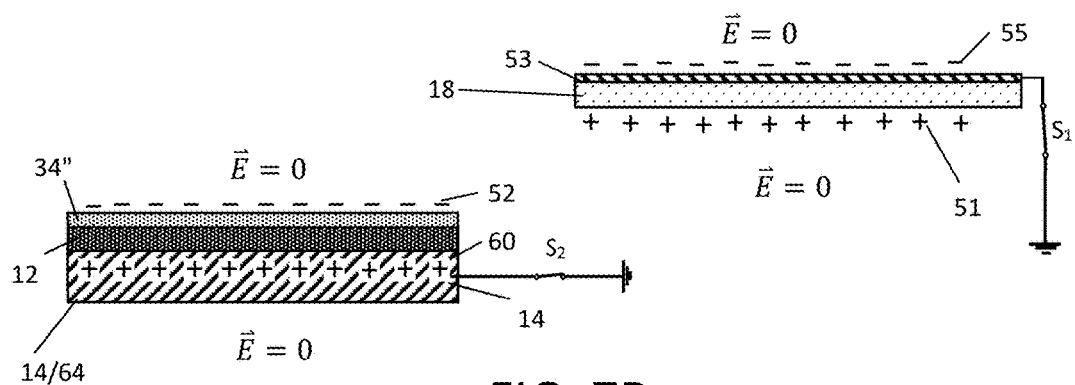

FIGS. 7A to 7B shows various stages of the lateral separation of the superstrate 18 with respect to the substrate 12. In the intermediate stage as shown in FIG. 7A, the electric field $\vec{E_0}$ exists in the overlapped area of the charges 51 and 52, while the electric field is zero or near zero outside the overlapped area. FIG. 7B shows the positions of the superstrate 18 and the substrate 12 when the lateral separation is complete and the charges 51 and 52 no longer overlap with each other. The electric field between the charges 51 and 52 is zero or near zero as there is no overlap between these charges. The charges 51 and 55 of the opposite signs at the superstrate 18 may compensate each other, the electric field across the superstrate 18 is zero or near zero. Similarly, the charges 52 and 56 may compensate each other, such that the electric across the substrate 12 is zero or near zero.

Figure 8:
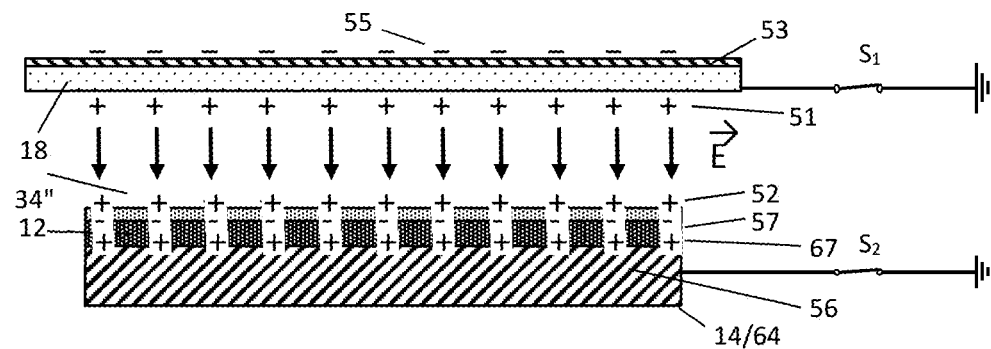
FIG. 8 shows the electric charge distribution when the substrate is conductive but includes an insulating film on both sides of the substrate.

In the embodiment as shown in FIG. 7B, the non-conductive substrate 12 is used for simplification. In real application, the substrate 12 may be conductive by different levels of doping. However, the substrate 12 often includes insulating film such as native silicon oxide $Si_2O$. FIG. 8 shows the electric field distribution when the substrate 12 is conductive but includes an insulating film similar to $SiO_2$ on the surface of the substrate 12. As shown, charges 57 and 67 are formed inside of the conductive substrate 12. The additional layer of electric charges (double charge layers) does not change the general approach as described with reference to FIGS. 7A and 7B.

Figure 9:
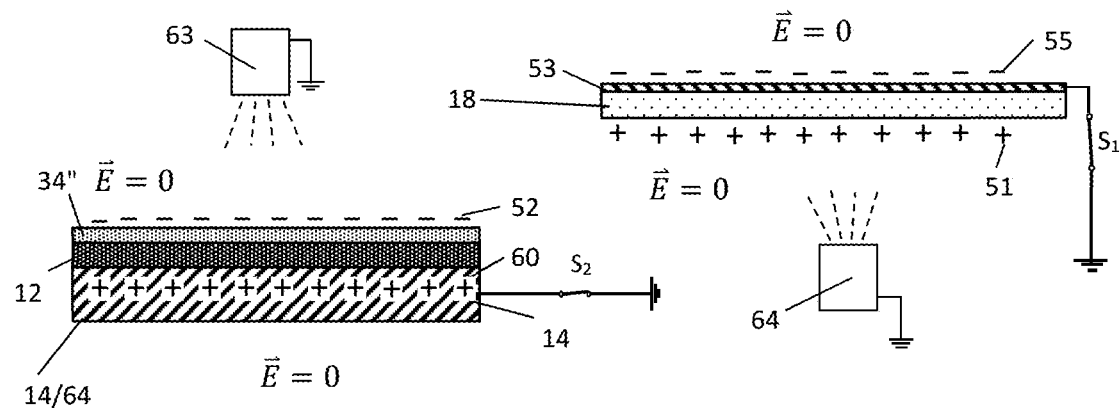
FIG. 9 shows the surface charges removal by electrically grounded ion discharge sources.

In FIG. 9, electrically grounded ion discharge sources 63 and 64, for example, alpha ionizers, X-rays, or other ionizing bars, may be placed near the surfaces of the substrate 12 and the superstrate 18 to remove the surface charges 51 and 52 after the lateral separation is complete.

Figure 10:
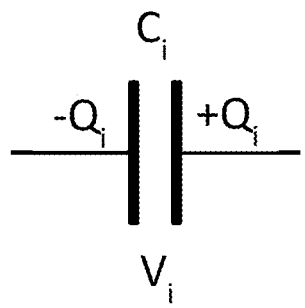
FIG. 10 shows an equivalent electric capacitor corresponding to a sandwich of a superstrate, a formable material, and a substrate.
Figure 11:
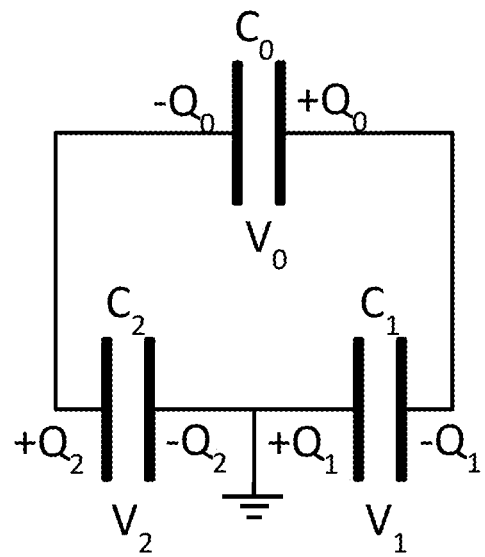
FIG. 11 shows an equivalent electric circuit of the structure as shown in FIG. 6B.

FIG. 10 shows an electrically equivalent capacitor scheme corresponding to the sandwich of the superstrate 18, the formable material 34", and the substrate 12. $Q_i$, $C_i$, and $V_i$ are the initial charges, initial capacitance, and initial voltage between the superstrate 18 and the formable material 34" at the initial separation. The initial charges $Q_i$ remain stable after the initial separation and plasma discharge. FIG. 11 shows an equivalent circuit of the structure as shown in FIG. 6B. As shown, by grounding the conductive structures 53 and 54, a closed loop of electric circuit is formed. The electric circuit includes capacitors $C_0$, $C_1$, and $C_2$ connected in series. The initial charges $Q_i$ is redistributed across the three capacitors $C_0$, $C_1$, and $C_2$. As the capacitors $C_1$ and $C_2$ are charged with the same electric current, $$|Q_1|=|Q_2| \qquad (0), \text{ and}$$

$$|Q_1|=|Q_i|-|Q_1| \qquad (1).$$

On the other hand, the voltages on the capacitors are related as:

$$V_0+V_1=V_2 \qquad (2).$$

The definition of a capacitor formula for each combination of the electric charge, voltage, and capacitance value can be used, for example, $$Q_0=C_0V_0 \qquad (3).$$

The equation (2) can then be rewritten as:

$$\frac{Q_0}{C_0} = \frac{Q_1}{C_1} + \frac{Q_2}{C_2}. \qquad (4)$$

Based on the above equations, the following relationships can be obtained:

$$Q_0 = Q_i \frac{C_1+C_2}{C_1+C_2+\frac{C_1C_2}{C_0}}; \qquad (5)$$

$$Q_1 = Q_i \frac{1}{1+\frac{C_0}{C_1}+\frac{C_0}{C_2}}; \qquad (6)$$

$$V_1 = \frac{Q_1}{C_1}; \text{ and} \qquad (7)$$

$$V_2 = V_1 \frac{C_1}{C_2}. \qquad (8)$$

A typical value for the electric field measured by an electrostatic voltmeter after initial separation as shown in FIG. 3C is around $10^6$ V/m. This value is close to the electric discharge value in dry air in the range of $1.5 \times 10^6$ V/m to $3 \times 10^6$ V/m. Higher electric fields would cause electric discharge in air or gas until the value of electric field falls below the value necessary for self-supported plasma discharge. The initial separation distance between the superstrate and the substrate in a typical imprint/planarization tool may be around 10 µm. Let's consider the substrate (wafer) and superstrate with a diameter of 300 mm, and with the substrate and the superstrate not connected to ground. The initial voltage $V_i$ can be estimated from the electric field strength, that is, $E_i=10^6$ V/m, and the distance d=10 µm. This results in the initial voltage as:

$$V_i=E_id_i=10 \text{ V}.$$

Using the planar capacitor approximation for the 300 µm circular electrodes spaced by 10 µm, $$C_i=6.25 \times 10^{-8} \text{ F}.$$

The initial electric charge $Q_i$ can be obtained using equation similar to Equation (3) as:

$$Q_i=6.25 \times 10^{-7} \text{ C}.$$

Consider the situation when the electrically conductive surfaces are grounded as shown in FIG. 6B. Using Equations (1) to (8), $Q_0=6.11 \times 10^{-7}$ C; $Q_1=Q_2=1.38 \times 10^{-8}$ C; $V_0=9.8$ V; $V_1=4.3$ V; and $V_2=5.5$ V when the gap is 10 µm. The same values will be obtained if the conductive surfaces were grounded before the initial separation between the superstrate and the substrate with primordial electric charge. That charge occurs due to physical contact of dissimilar materials. Therefore, the switches $S_1$ and $S_2$ may remain closed and ground the conductive surfaces at all times. Alternatively, the conductive surfaces may be ground at all times simply by connecting the ground with conductive wires. For a typical superstrate thickness of 700 µm, diameter of 300 mm, dielectric constant of glass 3.6, $C_1=3.2 \times 10^{-9}$ F can be calculated. Similarly, with a typical substrate thickness of 750 µm, diameter of 300 mm, and for example dielectric constant of silicon about 3, $C_2$ is about $2.51 \times 10^{-9}$ F.

Figure 12A:
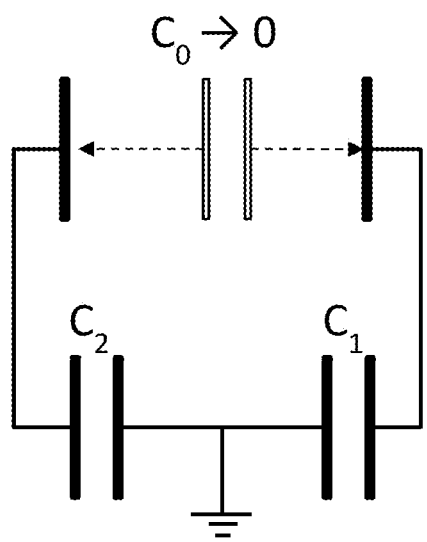
FIGS. 12A and 12B show the results of partial and complete lateral separation of the superstrate and the substrate as shown in FIG. 7A and FIG. 7B.
Figure 12B:
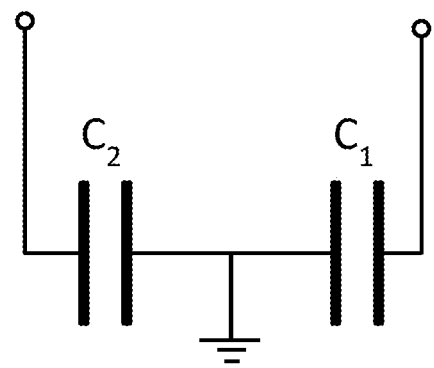

FIGS. 12A and 12B show the result of complete lateral separation of the superstrate and the substrate as shown in FIG. 7B. In FIG. 12A, the increased spatial separation of the superstrate and the substrate increases the space between the capacitor electrodes and reduce the capacitance $C_0$ until the capacitor $C_0$ disappears. When $C_0=0$, Equation (6) becomes:

$$Q_1 = Q_i \frac{1}{1+\frac{C_0}{C_1}+\frac{C_0}{C_2}} = Q_i; \qquad (9)$$

and Equation (7) is modified as:

$$V_1 = \frac{Q_i}{C_1} \qquad (10)$$

Figure 13:
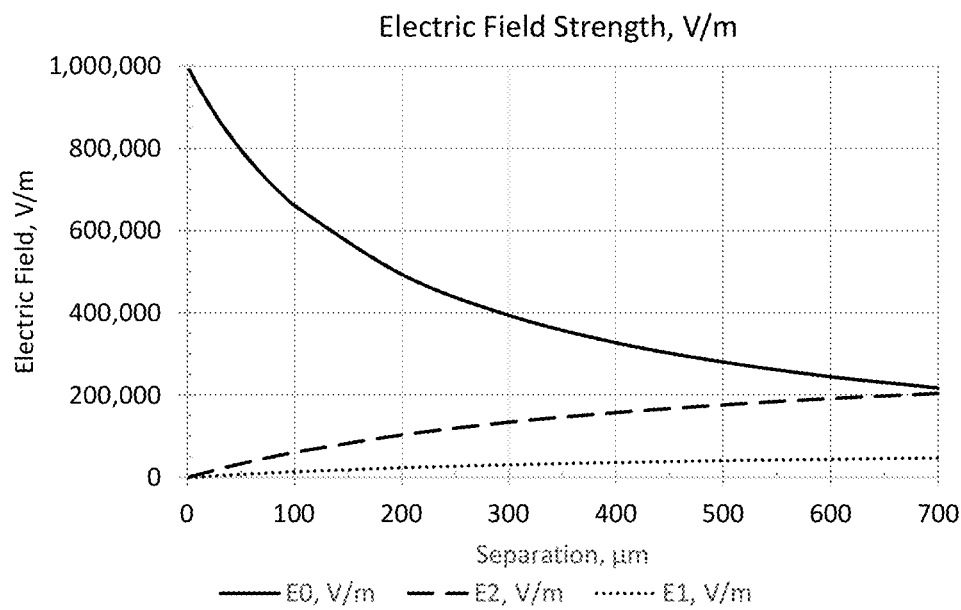
FIG. 13 shows the graph of the electric field strength as a function of vertical distance for different layers.

With $Q_i=6.25 \times 10^{-7}$ C and $C_1=3.2 \times 10^{-9}$ F, $V_1=195$ V, and $V_2=250$ V corresponding to Equation (7). Calculations of the electric field inside $C_1$ and $C_2$ gives $E_1=2.79 \times 10^5$ V/m and $E_2=3.33 \times 10^5$ V/m. Both of the values of electric fields are far from silicon and glass dielectric strength breakdown, and are considered safe. The separation of superstrate and the formable material/substrate with the conductive structures grounded results in initial low level of electric field and absence of electric field after significant separation. FIG. 13 shows the electric field strength $E_0$ in the space between the superstrate and the substrate, $E_1$ inside the superstrate, and $E_2$ space between the top surface of the substrate and the substrate chuck, as a function of vertical separation. The substrate is considered a semi-insulating silicon (Si), that is, non-conductive structure. As the vertical separation reaches 700 μm, the electric field $E_1$ falls to the level of 200,000 V/m.

Figure 14:
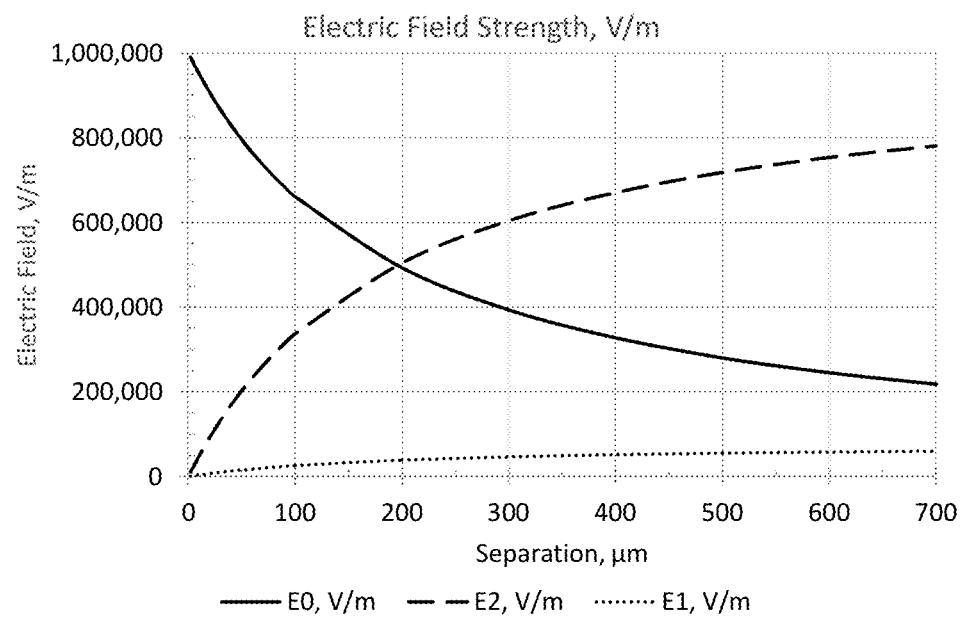
FIG. 14 shows the graph of the electric field strength as a function of vertical distance when the substrate and the substrate are considered conductive.

FIG. 14 shows the electric field strengths in the space between the superstrate and the substrate, $E_1$ inside the superstrate, and $E_2$ inside the space between the top surface of the substrate and the substrate chuck. The substrate and the substrate chuck are considered electrically conductive. The substrate chuck has pin area 5% and pin height of 0.1 μm. As the vertical separation reaches 700 μm, $E_1$ falls to the level of 200,000 V/m.

Figure 15:
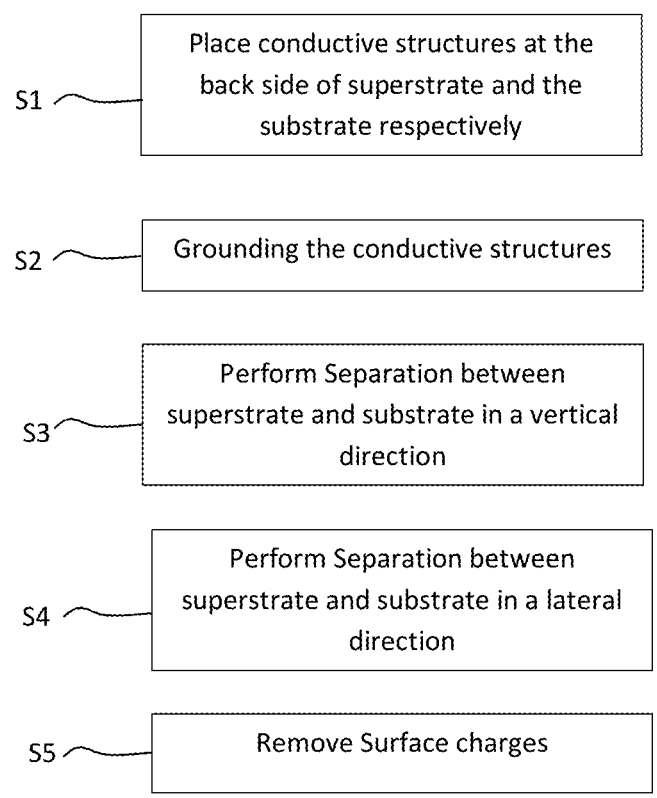
FIG. 15 shows the method of minimizing the electric field between the superstrate and the substrate caused by separation after the curing process.

FIG. 15 shows a process chart for separation process of a superstrate and a substrate after a curing process has been performed. In step S1, conductive structures are placed at the backside of the superstrate and the substrate. In step S2, the conductive structures are grounded. In step S3, the superstrate and the substrate are separated from each other in a vertical direction until the electric field between the superstrate and the substrate is below a predetermined value. In step S4, further separation between the superstrate and the substrate is performed in a lateral direction. The surface charges are then removed in step S5.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A system for forming a layer of formable material on a frontside of a substrate with a superstrate, comprising:
    a first conductive portion at a first side of the superstrate, wherein the superstrate having a second side opposite to the first side, and the second side is in contact with the formable material in a case where the superstrate is stacked with the substrate; and
    a second conductive portion at a backside of the substrate, wherein in the case where the superstrate is stacked with the substrate, both the first conductive portion and the second conductive portion are not in contact with the formable material: and
    wherein during a separation process in which the superstrate is separated from the formable material on the substrate, both the first conductive portion and the second conductive portion are grounded and the layer of formable material is formed on the frontside of the substrate; and
    wherein separating the superstrate from the substrate in a vertical direction in the separation process until the superstrate and the substrate is completely separated and an electric field between the superstrate and the substrate is reduced to a predetermined value; and moving the superstrate in a lateral direction with respect to the substrate.

2. The system according to claim 1, wherein the first conductive portion including a transparent conductive layer formed on the first side of the superstrate before an imprint process performed on the formable material.

3. The system according to claim 1, wherein the first conductive portion includes a conductive layer placed at the first side of the superstrate after a UV exposure has been performed on the formable material.

4. The system according to claim 3, wherein the conductive layer includes a conductive superstrate chuck to retain the superstrate during an imprint process.

5. The system according to claim 1, wherein the first conductive portion is made of chromium (Cr), tin nitride (TiN), or tin oxide ($SnO_2$).

6. The system according to claim 1, wherein the first conductive portion includes a conductive layer in the form of a film, a sheet, or a wire mesh.

7. The system according to claim 6, wherein the conductive layer has a thickness of about 10 nm to about 15 nm.

8. The system according to claim 1, wherein the second conductive portion includes a substrate chuck made of conductive material.

9. The system according to claim 8, wherein the conductive material includes silicon carbide (SiC).

10. The system according to claim 1, wherein the second conductive portion includes a conductive layer formed on the backside of the substrate.

11. The system according to claim 1, wherein the second conductive portion includes a conductive substrate chuck retaining the substrate during an imprint process.

12. A system for forming a layer of formable material on a frontside of a substrate, comprising:
    a superstrate chuck having a superstrate chucking surface that is configured to couple to a superstrate;
    a substrate chuck having a substrate chucking surface that is configured to couple to a backside of the substrate;
    a first conductive portion at the superstrate chucking surface; and
    a second conductive portion at the substrate chucking surface,
    wherein the superstrate chuck is configured to bring the superstrate in contact with the formable material so that the superstrate is stacked with the substrate, and both the first conductive portion and the second conductive portion are not in contact with the formable material, and
    wherein during a separation process in which the superstrate chuck and the substrate chuck are moving away from each other, both the first conductive portion and the second conductive portion are grounded and the layer of formable material is formed on the frontside of the substrate;
    wherein separating the superstrate chuck from the substrate chuck in a vertical direction in the separation process until the superstrate chuck and the substrate chuck is completely separated and an electric field between the superstrate chuck and the substrate chuck is reduced to a predetermined value; and moving the superstrate chuck in a lateral direction with respect to the substrate chuck.

* * * * *